(12) United States Patent
Tsukamoto et al.

(10) Patent No.: US 9,347,130 B2
(45) Date of Patent: May 24, 2016

(54) LANTHANUM TARGET FOR SPUTTERING

(75) Inventors: Shiro Tsukamoto, Ibaraki (JP); Tomio Otsuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 982 days.

(21) Appl. No.: 13/147,837

(22) PCT Filed: Mar. 17, 2010

(86) PCT No.: PCT/JP2010/054493
§ 371 (c)(1),
(2), (4) Date: Aug. 4, 2011

(87) PCT Pub. No.: WO2010/110134
PCT Pub. Date: Sep. 30, 2010

(65) Prior Publication Data
US 2011/0290644 A1 Dec. 1, 2011

(30) Foreign Application Priority Data

Mar. 27, 2009 (JP) ................................ 2009-078836

(51) Int. Cl.
| | | |
|---|---|---|
| *C23C 14/14* | (2006.01) | |
| *B22D 21/00* | (2006.01) | |
| *B22D 7/00* | (2006.01) | |

(Continued)

(52) U.S. Cl.
CPC ............ *C23C 14/3414* (2013.01); *B22D 21/00* (2013.01); *C22C 28/00* (2013.01); *C22F 1/16* (2013.01); *C23C 14/08* (2013.01)

(58) Field of Classification Search
CPC ......... B22D 21/00; C22C 38/005; C22F 1/16; C23C 14/3414

USPC ....................................................... 148/557
See application file for complete search history.

(56) References Cited

U.S. PATENT DOCUMENTS 5,074,935 A 12/1991 Masumoto et al.
7,156,963 B2 1/2007 Oda
(Continued)

FOREIGN PATENT DOCUMENTS

CN 1243171 A 2/2000
CN 1552939 A 12/2004
(Continued)

OTHER PUBLICATIONS

Bruzzone, The lanthanum-cadmium system, Journal of the Less-Common Metals, 1973, vol. 30, p. 303-305.*

(Continued)

*Primary Examiner* — Jie Yang
*Assistant Examiner* — Xiaowei Su
(74) *Attorney, Agent, or Firm* — Howson & Howson LLP

(57) ABSTRACT

Provided are a lanthanum target for sputtering which has a Vickers hardness of 60 or more and no spotty macro patterns on the surface, and a method of producing a lanthanum target for sputtering, wherein lanthanum is melted and cast to produce an ingot, the ingot is subject to knead forging at a temperature of 300 to 500° C. and subsequently subject to upset forging at 300 to 500° C. to form the shape into a rough target shape, and this is additionally subject to machining to obtain a target. This invention aims to offer technology for efficiently and stably providing a lanthanum target for sputtering that has no spotty macro patterns on the surface, and a method of producing the same.

4 Claims, 3 Drawing Sheets

(51) Int. Cl.
*B22D 25/02* (2006.01)
*C23C 14/34* (2006.01)
*C22C 28/00* (2006.01)
*C22F 1/16* (2006.01)
*C23C 14/08* (2006.01)

(56) References Cited

U.S. PATENT DOCUMENTS

| | | | |
|---|---|---|---|
| 7,716,806 B2 | 5/2010 | Oda | |
| 7,740,717 B2 | 6/2010 | Oda | |
| 8,038,911 B2 | 10/2011 | Inoue et al. | |
| 2001/0015243 A1* | 8/2001 | Shima et al. | 148/565 |
| 2007/0003790 A1 | 1/2007 | Tsukatani et al. | |
| 2007/0062806 A1 | 3/2007 | Oda | |
| 2007/0209930 A1* | 9/2007 | Chua et al. | 204/298.02 |
| 2007/0240795 A1 | 10/2007 | Sato et al. | |
| 2008/0063889 A1* | 3/2008 | Duckham et al. | 428/615 |
| 2008/0121522 A1 | 5/2008 | Ehira et al. | |
| 2008/0223718 A1 | 9/2008 | Takagi et al. | |
| 2009/0057139 A1 | 3/2009 | Fukushima et al. | |
| 2010/0108500 A1* | 5/2010 | Hawrylchak et al. | 204/298.13 |
| 2010/0272596 A1 | 10/2010 | Takahata et al. | |
| 2011/0114481 A1 | 5/2011 | Satoh et al. | |
| 2011/0114482 A1 | 5/2011 | Satoh et al. | |
| 2011/0162322 A1 | 7/2011 | Satoh et al. | |
| 2011/0308940 A1 | 12/2011 | Tsukamoto et al. | |
| 2012/0045380 A1 | 2/2012 | Satoh et al. | |
| 2013/0241010 A1 | 9/2013 | Takahata et al. | |
| 2013/0277214 A1 | 10/2013 | Narita et al. | |
| 2013/0313659 A1 | 11/2013 | Takahata et al. | |
| 2014/0199203 A1 | 7/2014 | Takahata et al. | |

FOREIGN PATENT DOCUMENTS

| | | |
|---|---|---|
| JP | H09-104972 A | 4/1997 |
| JP | 2000-345327 A | 12/2000 |
| JP | 2007-009288 A | 1/2007 |
| JP | 2007-169683 A | 7/2007 |
| SU | 511119 A | 7/1976 |
| WO | 2009/084318 A1 | 7/2009 |

OTHER PUBLICATIONS

Bolshutkin, Temperature dependence of the hardness of Lanthanum and Neodymium in the range 77-293 K, Phys Metals Metallogr, 1965, vol. 20, p. 151-154.*

Fort, Journal of the Less-Common Metals, 1981, vol. 81, p. 273-292.*

E. Tokumitsu et al., "A Study on High-Dielectric-Constant Oxide Materials for MOSFET Gate Insulator Applications", Denshi-zairyo Kenkyu-kai Shiryo of Institute of Electrical Engineers of Japan, vol. 6-13, pp. 37-41, Sep. 21, 2000.

Koji Mimura et al., "High Purification of Neodymium and Lanthanum by Electron Beam Floating Zone Melting", the Shigen-Sozai, vol. 1993, No. 1, pp. 3-6, 1993 (month unknown).

Nakahara, "Lanthanum", Mukikagoubuitsu/sakutai Jiten, Kodan-sha Ltd., p. 996, Jun. 10, 1987.

K. Shima, "Process of High-Purity Metals and Physical Property", CMC Publishing Co., Ltd., Trade Edition, 1st Printing, pp. 8 and 124-129, Dec. 2000.

J.J. Hanak et al., "The Effect of Grain Size on the Superconducting Transition Temperature of the Transition Metals", Physics Letters, vol. 30A, No. 3, pp. 201-202, Oct. 1969.

H. Balster et al., "Pressure-Induced Lattice Instability in fcc Lanthanum at Low Temperature", Journal of Low Temperature Physics, vol. 21, Nos. 3/4, pp. 377-414, Apr. 1975.

K.M. Bohlander, "Mechanical Fabrication of Rare Earth Metals", General Electric, pp. 1-24, Nov. 1959.

* cited by examiner

LANTHANUM TARGET FOR SPUTTERING

BACKGROUND OF THE INVENTION

The present invention relates to a lanthanum target for sputtering that has no spotty macro patterns on the surface, and to a method of producing the same.

Lanthanum (La) is one of the rare-earth elements, and is a mineral resource that is contained in the earth's crust as a mixed composite oxide. Rare-earth elements are so called because they are separated from relatively rare minerals, but they are not that rare in light of the overall earth's crust.

Lanthanum is a white metal having an atomic number of 57 and an atomic weight of 138.9, and comprises a double hexagonal close-packed structure at normal temperature.

Lanthanum has a melting point of 921° C., boiling point of 3500° C., and density of 6.15 g/cm$^3$. Its surface is oxidized in the atmosphere, and lanthanum gradually melts in water. Lanthanum is soluble in hot water and acid. Although it is not ductile, it is slightly malleable. The resistivity is $5.70 \times 10^{-6}$ Ωcm, and lanthanum becomes an oxide ($La_2O_3$) when burned at 445° C. or higher (refer to Dictionary of Physics and Chemistry).

With rare-earth elements, it is generally said that compounds with the oxidation number 3 are stable, and lanthanum is also trivalent. Lanthanum is a metal that is attracting attention as an electronic material such as a metal gate material or a high-dielectric (High-k) material, and research and development is recently being promoted.

Lanthanum metal is a material in which high purification is difficult to achieve since it is easily oxidized during the refining process. In addition, if lanthanum metal is left in the atmosphere, there is a problem in that the handling thereof is difficult since it will become oxidized and darkly-discolored in a short period of time.

In recent years, thinning of a gate insulator film in the next-generation MOSFET is being demanded, but with the $SiO_2$ that has been conventionally used as the gate insulator film, the leak current will increase due to the tunnel effect, and normal operation is becoming difficult.

Thus, as a substitute for the $SiO_2$ described above, $HfO_2$, $ZrO_2$, $Al_2O_3$ and $La_2O_3$ with high dielectric constant, high thermal stability, and high energy barrier against the holes and electrons in the silicon have been proposed. In particular, among the foregoing materials, $La_2O_3$ is valued highly and its electrical properties have been investigated. And its use as a gate insulator film in the next-generation MOSFET has been studied and reported (refer to Non Patent Document 1). Nevertheless, with Non Patent Document 1, the subject of research is a $La_2O_3$ film, and it does not make any reference to the properties and behavior of La element.

Moreover, Patent Document 1 relates to lanthanum primarily for use as a target material (and the production method thereof). Although it describes producing a target with lanthanum, it could not be used as a reference since there was no specific description concerning the method (conditions) of producing such a target.

It could be said that lanthanum (lanthanum oxide) is still in the research phase, but when studying the properties of such lanthanum (lanthanum oxide), if lanthanum metal itself exists as a target material for sputtering, it is possible to form a lanthanum thin film on a substrate. It will also be easy to study the behavior at the interface with the silicon substrate, and additionally study the properties of a high-dielectric gate insulator film or the like by forming a lanthanum compound, and there is also a significant advantage in that the freedom of the target as a product will increase.

Nevertheless, even if a lanthanum target for sputtering is prepared, as described above, it becomes oxidized in a short period of time (approximately 10 minutes) in the atmosphere. When an oxide film is formed on the target, the electrical conductivity will deteriorate and thereby cause defective sputtering. In addition, if the lanthanum target is left in the atmosphere for a long period of time, it reacts with the moisture in the air and becomes covered with white hydroxide powder, and it may even cause a problem of not allowing normal sputtering to be performed. Thus, measures for preventing oxidation after the target is prepared are being considered.

Nevertheless, even if the foregoing problems can be resolved, there are other problems. Specifically, at the stage of preparing a target from the molten ingot, spotty macro patterns (unevenly colored macro patterns) appear on the machined surface of the lanthanum target. FIG. 1 shows a photograph of the lanthanum target with spotty macro patterns on its surface.

In FIG. 1, the generation of spotty macro patterns (appearing like cloud) can be observed at the part slightly outside the center of target and the outlying part of target. This is a coarsened structure as shown in the Comparative Examples described later, and is an imbalanced structure in comparison to the other parts of the material.

This causes the problem of uneven deposition during sputtering and the problem of causing the generation of particles. Accordingly, it is necessary to take measures for preventing the occurrence of such spotty macro patterns, but the problem could not be resolved to date. In addition, the current situation is that there is no recognition that this kind of problem even exists in a lanthanum target.

[Non Patent Document 1] Written by Eisuke Tokumitsu and two others, "Research on Oxide Material for High-k Gate Insulator Film", The Institute of Electrical Engineers of Japan, Research Paper of Electronic Materials, Vol. 6-13, Pages 37 to 41, Published on Sep. 21, 2001

[Patent Document 1] International Publication No. WO2009/084318

SUMMARY OF THE INVENTION

An object of this invention is to offer technology for efficiently and stably providing a lanthanum target for sputtering that has no spotty macro patterns on the surface, and a method of producing the same.

As described in the section of Background Art above, lanthanum is a material of which surface is susceptible to spotty macro patterns during the process of producing the target, but the present inventors discovered that the occurrence of spotty macro patterns on the surface can be reduced by increasing the hardness of the lanthanum target and maintaining a certain level of hardness. Specifically, based on the foregoing discovery, the present invention provides a lanthanum target for sputtering which has a Vickers hardness of 60 or more and no spotty macro patterns on the surface.

It is thereby possible to realize the uniformity of deposition during sputtering, as well as effectively inhibit the generation of particles.

A LaOx film is mainly formed for use as a gate insulator film in MOSFET. Nevertheless, when forming this kind of film, lanthanum metal is required in order to form an arbitrary film or to increase the freedom in forming the film. The present invention is able to provide a target material capable of complying with the foregoing requirement.

Although it is desirable to use a high-purity material as the raw material of lanthanum that is used in the present invention, impurities that are normally contained are tolerated. In particular, the rare-earth elements contained in lanthanum include Sc, Y, Ce, Pr, Nd, Pm, Sm, Eu, Gd, Tb, Dy, Ho, Er, Tm, Yb, and Lu in addition to lanthanum (La), but it is difficult to separate and refine these elements from La since they have similar properties. In particular, since Ce is approximate to La, it is difficult to reduce Ce. Nevertheless, since these rare-earth elements have approximate properties, so as long as the total amount of rare-earth elements is less than 1000 wtppm, there is no particular problem when used as an electronic component material.

Accordingly, the lanthanum target of the present invention can tolerate the inclusion of rare-earth elements at the foregoing level. Nevertheless, in order to take advantage of the properties of the lanthanum element, it could be said that the total amount of rare-earth elements excluding lanthanum is preferably 100 wtppm or less, more preferably 10 wtppm or less, and, even more preferably, the content of each rare-earth element is 1 wtppm or less. The present invention is able to achieve and covers all of the above.

Generally speaking, C, N, O, S, and H exist as gas components. These gas components may exist as independent elements, but in many cases they exist as compounds (CO, $CO_2$, $SO_2$ and so on) or sometimes exist in the form of compounds with the constituent elements. Since these gas component elements have a small atomic weight and atomic radius, so as long as they are not contained in large amounts, they will hardly affect the properties of the material even when existing as impurities. Accordingly, when indicating the purity, it is common practice to indicate the purity excluding gas components.

In this respect, the lanthanum of the present invention is limited to have a purity of 3N or higher excluding gas components. With lanthanum refined to this level, the gas components will also decrease proportionately. For instance, there will be no particular problem if the amount of oxygen contained in the lanthanum is 2000 wtppm or more, or in certain cases 5000 wtppm or less. Nevertheless, it should be understood that the present invention is not aiming to achieve an oxygen content in the vicinity of 5000 wtppm. Specifically, it goes without saying that it is desirable for the amount of oxygen to be as low as possible. The present invention aims to achieve an oxygen content of 1500 wtppm or less and even less than 1000 wtppm, and has achieved the foregoing figures.

Moreover, the lanthanum target of the present invention preferably has a purity of 4N or higher excluding rare-earth elements and gas components. In particular, it is preferable that the amounts of aluminum, iron and copper in the lanthanum are respectively 100 wtppm or less, oxygen content is 1500 wtppm or less, elements of alkali metals and alkali earth metals are respectively 1 wtppm or less, elements of transition metals and high-melting-point metals other than the foregoing elements are respectively 10 wtppm or less, and radioactive elements are respectively 10 wtppb or less.

Upon producing the lanthanum target for sputtering, lanthanum as the raw material is melted and cast to produce an ingot, the ingot is subject to knead forging at a temperature of 300 to 500° C. and subsequently subject to upset forging at 300 to 500° C. to form the shape into a rough target shape, and this is additionally subject to machining to obtain a target. Note that the knead forging is hot forging in which considerable strains are applied alternately from the longitudinal direction and lateral direction in order to destroy the cast structure of the ingot.

It is thereby possible to produce a lanthanum target for sputtering which has a Vickers hardness of 60 or more and no spotty macro patterns on the surface. Note that, if the Vickers hardness is less than 60, "burr" of the surface will occur, and therefore a Vickers hardness of 60 or more is an essential requirement. This is further cut into a predetermined size and subject to the grinding process in order to obtain a sputtering target.

The present invention relates to a lanthanum target for sputtering which has a Vickers hardness of 60 or more and no spotty macro patterns on the machined surface, and if sputtering is performed with the lanthanum target obtained as described above, superior effects are yielded in that uniform deposition is enabled and the generation of particles is inhibited.

DETAILED DESCRIPTION OF THE INVENTION

Figure 1:
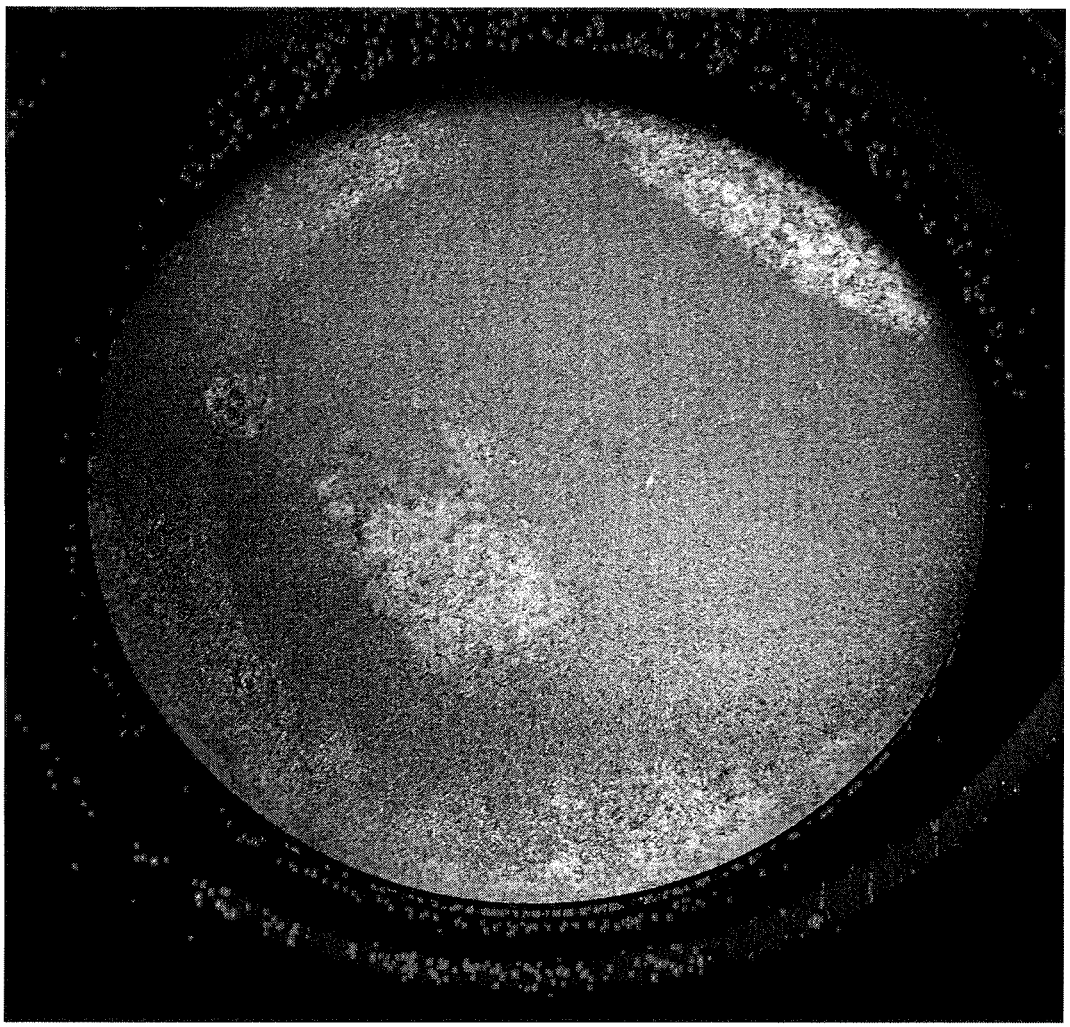
FIG. 1 is a photograph showing the spotty macro patterns (unevenly colored macro patterns) on the machined target surface.

The present invention eliminated spotty macro patterns from the lanthanum target and further increased the hardness of the target. The production process is important in order to increase the hardness.

In order to produce the lanthanum target for sputtering of the present invention, lanthanum is melted and cast (solidified) to produce an ingot. The obtained ingot is subsequently subject to knead forging at a temperature of 300 to 500° C.

With conventional processing methods, under normal circumstances, the ingot is directly subject to forging at a high temperature (around 800° C.) and formed into a target shape, and subsequently subject to machining to produce the target. Nevertheless, since lanthanum is soft and possesses ductility, there is a problem in that a material produced under the foregoing forging conditions is subject to "burr" during the machining process and this remains on the lanthanum target surface.

Moreover, with conventional production methods, there is a problem in that spotty macro patterns appear on the machined lanthanum surface. If there are spotty macro patterns or "burr" on the lanthanum target surface as described above, there is a major problem in that particles are generated during sputtering and uniform deposition cannot be achieved.

In substitute for the problematic conventional production methods described above, the present inventors, as a result of conducting numerous experiments, devised the production conditions and achieved a lanthanum target for sputtering that has no spotty macro patterns on the surface.

The present invention is unique in that the ingot is subject to knead forging at a temperature of 300 to 500° C. in order to destroy the structure of the ingot. Moreover, work hardening is performed to the material during the knead forging process in order to increase the hardness. Since these are severe processing conditions for lanthanum metal, it is necessary to perform warm forging at 300° C. or higher. Contrarily, since lanthanum metal will soften at a temperature exceeding 500° C., it is not possible to sufficiently increase the hardness.

Subsequently, upset forging is additionally performed at 300 to 500° C. to form the shape into a rough target shape. Based on this upset forging, the diameter is increased to achieve the rough shape of the lanthanum target. This is further subject to machining to obtain a target. Finish processing (grinding) may also be subsequently performed as needed.

Consequently, the hardness of the lanthanum target itself becomes a Vickers hardness of 60 or more, and no spotty macro patterns were observed on the surface of the lanthanum target prepared as described above. Moreover, the occurrence of any "burr" was not observed on the surface during the machining process.

The target prepared as described above has an unrecrystallized structure since it is in a state of having been subject to the forge processing, but it may also be subject to recrystallization annealing as needed. In the foregoing case, it is necessary to maintain fine crystals.

A major difference as described above can be acknowledged in the structure of the lanthanum target of the present invention, but in order to examine such difference, the crystal orientation of the structure was observed based on X-ray diffraction (XRD). Nevertheless, with XRD, a significant difference could not be acknowledged.

Nevertheless, the lanthanum target of the present invention achieved a result where the peak intensity of (101) is stronger than the peak intensity of (100) in comparison to the lanthanum targets obtained with the conventional production method described later. This result will be explained once again in the Example and Comparative Examples described later.

With the lanthanum target of the present invention, the prepared target is bonded with a backing plate, but the target is generally bonded with a copper (so-called OFC "oxygen-free copper") backing plate based on diffusion bonding (DB) rather than brazing.

Nevertheless, it is desirable to use a copper-chromium (Cu-1% Cr) alloy backing plate so as to prevent any peeling or floating of the bond part. When this kind of copper-chromium alloy backing plate is used, favorable bonding can be performed without causing any peeling or floating of the bond part between the target and the backing plate during sputtering. The use of this backing plate is a unique feature of the lanthanum target of the present invention.

EXAMPLE

The Example of the present invention is now explained. Incidentally, this Example is merely for facilitating the understanding of the invention, and the present invention shall in no way be limited thereby. In other words, various modifications and other embodiments based on the technical spirit claimed in the claims shall be covered by the present invention as a matter of course.

Example 1

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was subject to knead forging in the atmosphere at a temperature of 400° C., and thereafter subject to upset forging at 300 to 500° C. to increase its diameter and form the shape into a rough target shape, and this was further subject to machining to obtain a disk-shaped target of φ140× 14 t (units are all mm; hereinafter the same). The weight of this target was 1.42 kg. This target was diffusion-bonded to a copper-chromium alloy backing plate to obtain a lanthanum target for sputtering.

The lanthanum target for sputtering prepared as described above had a Vickers hardness of 70, and satisfied the conditions of the present invention.

Figure 2:
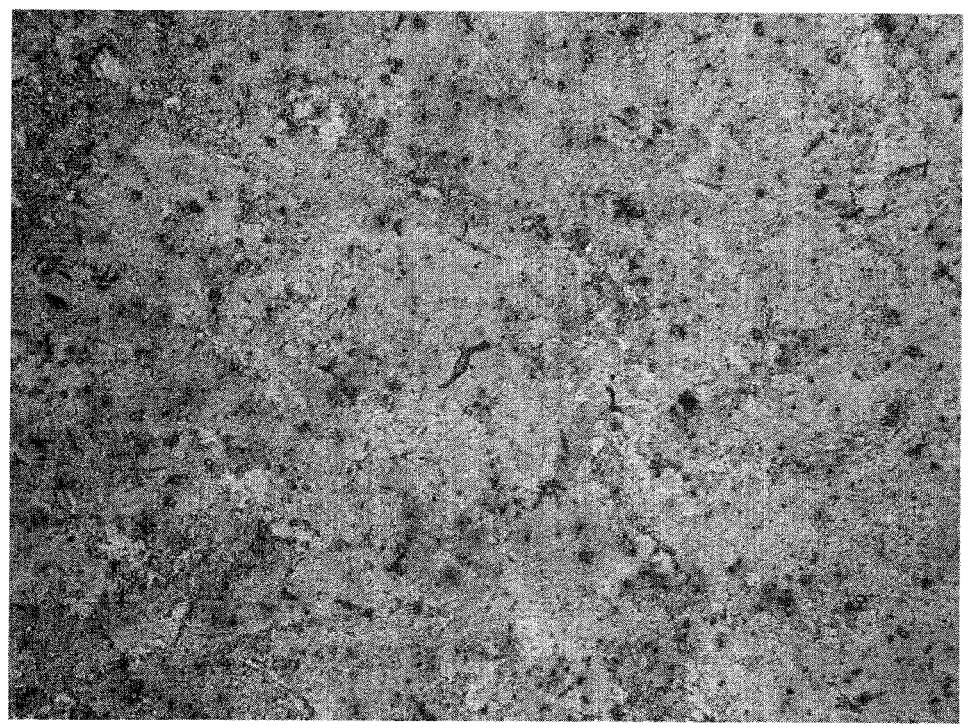
FIG. 2 is a micrograph (×50) of the machined target surface of the Example of the present invention.

In order to observe the structure of the lanthanum target for sputtering obtained as described above, etching was performed using 1 wt % nitric acid aqueous solution. FIG. 2 shows the micrograph (×50) showing the results. The structure of the target was an unrecrystallized structure. As shown in FIG. 2, spotty macro patterns were not observed on the surface of the lanthanum target for sputtering.

Figure 3:
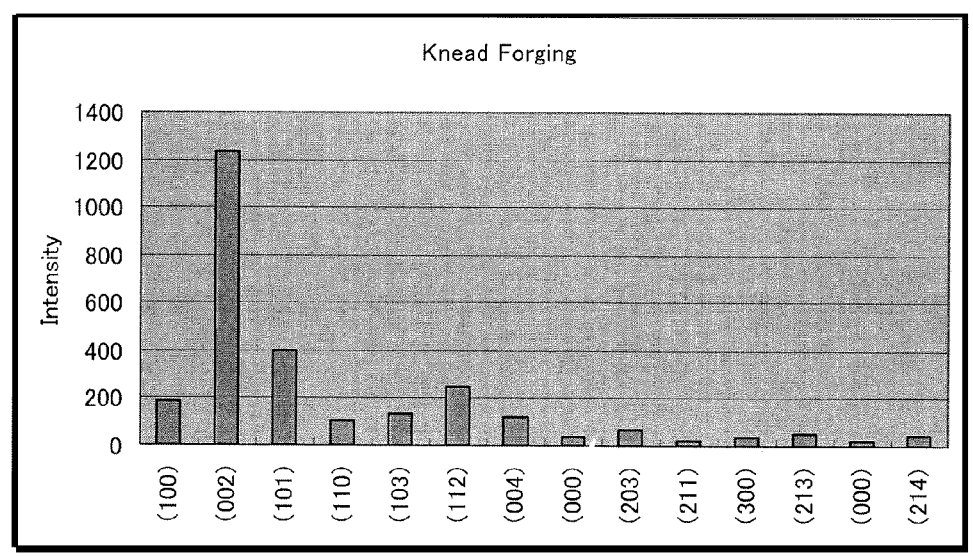
FIG. 3 is a diagram showing the peak of the crystal orientation of the Example of the present invention based on XRD.

Meanwhile, FIG. 3 shows the results of measuring the crystal orientation of the lanthanum target for sputtering obtained in this Example based on X-ray diffraction (XRD). In comparison to the lanthanum target of Comparative Example 1 described later, other than that the peak intensity of (101) was stronger than the peak intensity of (100), there was no significant difference in the results. Consequently, it is considered that the difference in crystal orientation does not greatly affect the generation of spotty macro patterns in the present invention.

In addition, the lanthanum target for sputtering was sputtered under the condition of 100 W power. Consequently, a uniform film was formed on the substrate without generating any particles. Moreover, even when sputtering was performed for a long period of time, favorable sputtering was enabled without the target floating from the backing plate and without any peeling between the target and the backing plate. Consequently, it was confirmed that diffusion bonding with the copper-chromium alloy backing plate is effective.

Comparative Example 1

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was hot pressed (HP) in a vacuum at a temperature of 800° C. to increase its diameter and form the shape into a rough target shape, and this was further subject to machining to obtain a disk-shaped target of φ140× 14 t. The weight of this target was 1.42 kg. This target was diffusion-bonded to a copper backing plate to obtain a lanthanum target for sputtering.

The lanthanum target for sputtering prepared as described above had a Vickers hardness of 51, and did not satisfy the conditions of the present invention.

Figure 4:
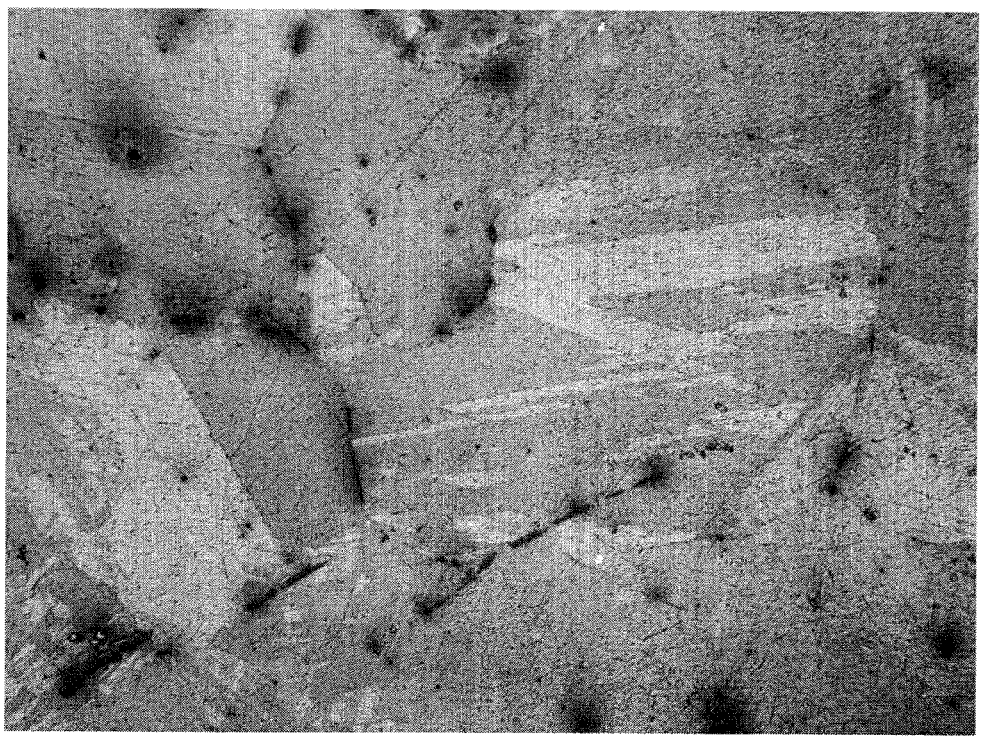
FIG. 4 is a micrograph (×100) of the machined target surface of the Comparative Example 1.

In order to observe the structure of the lanthanum target for sputtering obtained as described above, etching was performed using 1 wt % nitric acid aqueous solution. FIG. 4 shows the micrograph (×100) showing the results. As shown in FIG. 4, the structure of the target was a coarse crystal structure with a crystal grain size of 200 to 300 μm, and spotty macro patterns were observed on the surface of the lanthanum target for sputtering.

Figure 5:
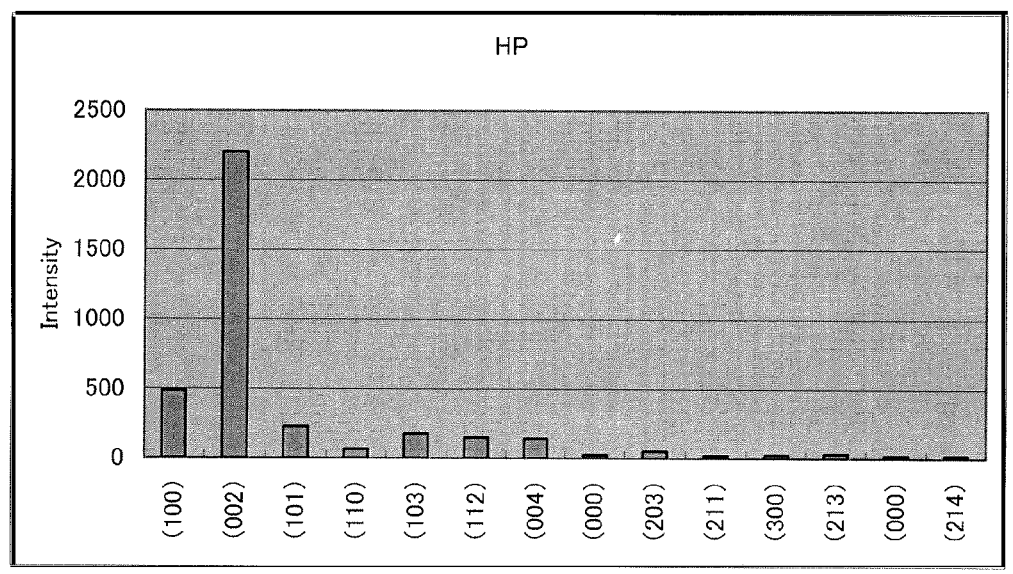
FIG. 5 is a diagram showing the peak of the crystal orientation of the Comparative Example 1 based on XRD.

Meanwhile, FIG. 5 shows the results of measuring the crystal orientation of the lanthanum target for sputtering obtained in this Comparative Example based on X-ray diffraction (XRD). In comparison to the lanthanum target of Example 1, other than that the peak intensity of (100) was stronger than the peak intensity of (101), there was no significant difference in the results. Consequently, it is considered that the difference in crystal orientation does not greatly affect the generation of spotty macro patterns.

In addition, the lanthanum target for sputtering was sputtered under the condition of 100 W power. Consequently, the generation of particles increased in comparison to the Example, and the deposition to the substrate was not uniform.

Moreover, although there was no peeling between the target and the backing plate during the sputtering process, the target tended to slightly float from the backing plate. It is considered that this did not have a major effect since the sputtering time was short.

Nevertheless, when sputtering was performed for a long period of time, peeling occurred between the target and the backing plate as expected. Consequently, it was confirmed that it is preferable to use the copper-chromium alloy backing plate used in the Example.

Comparative Example 2

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was subject to knead forging in the atmosphere at a temperature of 600° C. and subsequently subject to upset forging at 300 to 500° C. to increase its diameter and form the shape into a rough target shape, and this was further subject to machining to obtain a disk-shaped target of $\phi 140 \times 14$ t. The weight of this target was 1.42 kg. This target was diffusion-bonded to a copper backing plate to obtain a lanthanum target for sputtering.

The lanthanum target for sputtering prepared as described above had a Vickers hardness of 52, and did not satisfy the conditions of the present invention.

In order to observe the structure of the lanthanum target for sputtering obtained as described above, etching was performed using 1 wt % nitric acid aqueous solution. The structure of the target was a coarse crystal structure with a crystal grain size of 150 to 250 μm, and spotty macro patterns were observed on the surface of the lanthanum target for sputtering. Consequently, it was confirmed that it is preferable to subject the ingot to knead forging at a temperature of 300 to 500° C.

Meanwhile, the crystal orientation of the lanthanum target for sputtering obtained in this Comparative Example was measured based on X-ray diffraction (XRD). As with the lanthanum target of Example 1, the peak intensity of (101) was stronger than the peak intensity of (100). Consequently, it is considered that the crystal orientation does not greatly affect the generation of spotty macro patterns.

In addition, the lanthanum target for sputtering was sputtered under the condition of 100 W power. Consequently, the generation of particles increased in comparison to the Example, and the deposition to the substrate was not uniform.

Moreover, although there was no peeling between the target and the backing plate during the sputtering process, the target tended to slightly float from the backing plate. It is considered that this did not have a major effect since the sputtering time was short.

Nevertheless, when sputtering was performed for a long period of time, peeling occurred between the target and the backing plate as expected. Consequently, it was confirmed that it is preferable to use the copper-chromium alloy backing plate used in the Example.

The lanthanum target for sputtering which has a Vickers hardness of 60 or more and no spotty macro patterns on the surface obtained with the present invention is free from the generation of particles during sputtering and enables uniform deposition. It is thereby possible to resolve the foregoing conventional problems, and a thin film obtained by sputtering the lanthanum target of the present invention is useful as an electronic material; particularly as a gate insulator film or a metal gate thin film.

The invention claimed is:

1. A lanthanum metal target for sputtering having a purity excluding gas components of 3N or higher, a Vickers hardness of HV60 or more, and a non-recrystallized structure with no spotty macro patterns on a surface of the target.

2. The lanthanum metal target for sputtering according to claim 1, wherein the target consists of lanthanum metal of a purity excluding gas components of 4N or higher.

3. The lanthanum metal target for sputtering according to claim 1, further comprising a copper-chromium alloy backing plate diffusion bonded to the lanthanum metal target.

4. A method of producing a lanthanum metal target for sputtering, wherein lanthanum is melted and cast to produce an ingot, the ingot is subject to knead forging at a temperature of 300 to 500° C. and subsequently subject to upset forging at 300 to 500° C. to form the shape into a rough target shape, and this is additionally subject to machining to obtain a target having a purity excluding gas components of 3N or higher, a Vickers hardness of HV60 or more, and a non-recrystallized structure with no spotty macro patterns on a surface of the target.

* * * * *